(12) United States Patent
Ostermann

(10) Patent No.: US 8,389,318 B2
(45) Date of Patent: Mar. 5, 2013

(54) METHOD OF PRODUCING A THIN FILM PHOTOVOLTAIC SYSTEM, AND A THIN FILM PHOTOVOLTAIC SYSTEM

(75) Inventor: Dieter Ostermann, Neuss (DE)

(73) Assignee: Zylum Beteiligungsgesellschaft mbH & Co. Patente II KG, Schonefeld/Waltersdorf (DE)

( * ) Notice: Subject to any disclaimer, the term of this patent is extended or adjusted under 35 U.S.C. 154(b) by 402 days.

(21) Appl. No.: 12/701,061

(22) Filed: Feb. 5, 2010

(65) Prior Publication Data
US 2010/0200047 A1 Aug. 12, 2010

(30) Foreign Application Priority Data
Feb. 6, 2009 (DE) .................. 10 2009 007 908

(51) Int. Cl.
*H01L 21/00* (2006.01)
(52) U.S. Cl. ........................... 438/57; 438/98
(58) Field of Classification Search ........................ None
See application file for complete search history.

(56) References Cited

U.S. PATENT DOCUMENTS

| | | | | |
|---|---|---|---|---|
| 3,415,678 | A * | 12/1968 | Gutierrez et al. | 438/479 |
| 4,139,857 | A * | 2/1979 | Takagi et al. | 136/255 |
| 4,401,839 | A | 8/1983 | Pyle | |
| 4,784,701 | A | 11/1988 | Sakai et al. | |
| 7,227,196 | B2 * | 6/2007 | Burgener et al. | 257/103 |
| 7,432,577 | B1 | 10/2008 | Weiss et al. | |
| 2005/0000565 | A1 * | 1/2005 | Zeng | 136/256 |
| 2005/0284516 | A1 | 12/2005 | Koll | |
| 2007/0012356 | A1 | 1/2007 | Nanu et al. | |
| 2008/0213641 | A1 | 9/2008 | Ostermann et al. | |
| 2009/0217971 | A1 * | 9/2009 | Guha et al. | 136/255 |
| 2009/0217972 | A1 * | 9/2009 | Guha et al. | 136/255 |
| 2010/0236614 | A1 * | 9/2010 | Klimov et al. | 136/255 |

FOREIGN PATENT DOCUMENTS

| | | |
|---|---|---|
| DE | 3709153 A1 | 10/1987 |
| DE | 3801989 A1 | 7/1989 |
| DE | 4301128 A1 | 7/1994 |
| DE | 102004012303 B3 | 7/2005 |
| EP | 1617487 A2 | 1/2006 |

(Continued)

OTHER PUBLICATIONS

German translation of Office Action issued Mar. 7, 2012 in JP Application No. 2010-024495.

(Continued)

*Primary Examiner* — Scott B Geyer
(74) *Attorney, Agent, or Firm* — Panitch Schwarze Belisario & Nadel LLP

(57) ABSTRACT

A method of producing a thin film photovoltaic system (2) having a two-dimensional metal chalcogenide compound semiconductor layer (7) as an absorber of sunlight and a metal layer (8) applied to the metal chalcogenide compound semiconductor layer is provided, wherein the metal chalcogenide compound semiconductor layer (7) and the metal layer (8) form a Schottky contact at their contact face. The method is characterized in that the metal chalcogenide compound semiconductor layer (7) is produced by applying a dispersion containing nanoscale particles having a diameter of about 3 nm to about 30 nm to a transparent substrate material (12), wherein the layer thickness of the metal chalcogenide compound semiconductor layer (7) applied to the substrate material ranges from about 150 nm to about 2500 nm.

18 Claims, 5 Drawing Sheets

FOREIGN PATENT DOCUMENTS

| | | |
|---|---|---|
| EP | 1232530 B1 | 5/2006 |
| JP | 58-207679 A | 12/1983 |
| JP | 2002-314107 A | 10/2002 |
| JP | 2003-511867 A | 3/2003 |
| JP | 2006-310680 A | 11/2006 |
| WO | 2007095386 A2 | 8/2007 |
| WO | 2008129250 A2 | 10/2008 |
| WO | 2009112397 A1 | 9/2009 |

OTHER PUBLICATIONS

Int'l Preliminary Report on Patentability and Written Opinion issued Sep. 6, 2011 in Int'l Application No. PCT/EP2010/051406.
Luther et al, "Schottky Solar Cells Based on Colloidal Nanocrystal Films," Nano Letters, vol. 8, No. 10, pp. 3488-3492 (2008).

\* cited by examiner

METHOD OF PRODUCING A THIN FILM PHOTOVOLTAIC SYSTEM, AND A THIN FILM PHOTOVOLTAIC SYSTEM

BACKGROUND OF THE INVENTION

The invention relates to a method of producing a thin film photovoltaic system, to a thin film photovoltaic system and its use, particularly in a photovoltaic module for converting solar energy into electrical energy.

A reaction cell for photo-electrochemically producing hydrogen gas is known from German Patent DE 10 2004 012 303 B3. In the described technical solution, a housing filled with an aqueous electrolyte is provided in which a first electrode consisting of a doped semiconductor material, e.g. $TiO_2$ or $SrTiO_3$, and a second electrode consisting of a noble or semi-precious metal, or oppositely doped as compared to the first electrode, are provided. The two electrodes are connected to one another in an electrically conducting manner and are irradiated by a light source during operation. The electrodes are arranged such that the reaction cell is divided into two chambers which are interconnected in an ion-conducting manner. The hydrogen forming within the reaction chamber is discharged through a gas outlet opening.

Furthermore, European Patent EP 1 232 530 B1 describes a semiconductor component for detecting UV radiation. In this case, a semiconductor is provided as a substrate comprising a metal chalcogenide compound semiconductor material as an optical absorbing material for UV radiation, wherein the semiconductor forms a Schottky contact with a metal. The semiconductor so provided with a nanocrystalline metal chalcogenide compound semiconductor layer is conductively connected to an electrical contact layer or a metallic substrate on one side, and, on the other side, to a metal layer which is at least partially transparent to UV radiation.

A further PV (photovoltaic) system consisting of a metal chalcogenide compound semiconductor layer ($TiO_2$) and a metal layer is described in International patent application publication WO 2009/0112397 A2. At the core of the therein described invention is a superficially nanostructured silver layer in which a plasmon resonance is induced upon incidence of visible light. Practical tests, however, showed that this plasmon resonance does not efficiently contribute to charge carrier separation since the induced oscillation propagates parallel and not perpendicular to the extension of the Schottky barrier between the silver layer and the $TiO_2$ layer. Furthermore, a plasmon resonance is only achieved when the angle of incidence of the irradiated light is exactingly adjusted.

BRIEF SUMMARY OF THE INVENTION

Starting from the known prior art, the invention is based on the object of proposing a comparatively simple and cost-efficient method of producing a thin film photovoltaic system suitable for use in a solar cell. The aim is to be able to produce large-surface PV modules in a manner as effective and cost-efficient as possible.

The aforementioned object is solved by a method of producing a thin film photovoltaic system having a two-dimensional metal chalcogenide compound semiconductor layer as an absorber of sunlight and a metal layer applied to the metal chalcogenide compound semiconductor layer, wherein the metal chalcogenide compound semiconductor layer and the metal layer form a Schottky contact at their contact face, wherein according to the method the metal chalcogenide compound semiconductor layer is produced by applying a dispersion containing nanoscale particles having a diameter of about 3 nm to about 30 nm to a transparent substrate material, wherein the layer thickness of the metal chalcogenide compound semiconductor layer applied to the substrate material ranges from about 150 nm to about 2000 nm.

The invention is thus characterized by a modification of the layer structure known from prior art and its appropriate integration into known technical solutions for producing solar modules.

The method is comparatively easy to carry out and enables the cost-efficient production of—even large-surface—PV modules. The selection of comparatively cost-efficient materials such as palladium (instead of platinum) enables the production costs to be further lowered.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
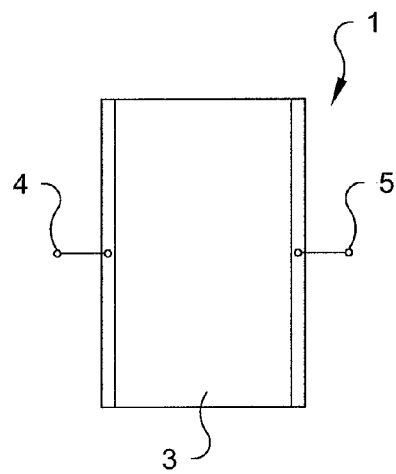
FIG. 1 is a schematic top view of a thin film PV system based on a monocell having the photosensitive portion and a TCO (transparent conductive oxide) terminal, and a terminal of the metallic Schottky contact connection.

FIG. 1 shows a schematic top view of a simple thin film PV system 1 based on a monocell having the photosensitive portion 3 and the TCO (transparent conductive oxide) terminal 4 and a metallic Schottky contact 5.

If n-doped $TiO_2$ having a thin platinum Schottky electrode is selected as the semiconductor material, a voltage of about 0.4 V can thus be achieved at the terminals 4, 5. With a typical efficiency of 3 to 12%, such a monocell is not suited for large-surface formats, since usual TCO layers (ITO (indium tin oxide), ATO (antimony tin oxide), FTO (fluorine doped tin oxide), ZnO (zinc oxide), semitransparent metallic thin films of gold, thin films based on single-wall carbon nanotubes or silver-wire thin films) have comparatively high sheet resistances and only reach values of below 10 $\Omega/m^2$ at a concurrently lower transparency to natural light.

The TEC Glass #8/3 from the Pilkington Specialty Glass Products Company, Toledo, Ohio 43697-0799, USA, for instance, has an electric sheet resistance of $\leq 9$ $\Omega/m^2$ at a natural light transmittance of 77%.

Since one electrode side needs to be configured to be possibly transparent to sunlight in the selected Schottky contact PV solution, it is required to optimize especially large cells with respect to an improved electrical conductivity with a concurrent reduction of sunlight transmittance being as low as possible.

For this purpose, so-called bus bars, hence electrically highly conductive lines which are usually arranged in the edge area, preferably assist in reducing the specific current load.

Bus bars in the form of silver pastes, silver-aluminum pastes or aluminum pastes are applied by screen printing, stenciling, a dispenser, an ink jet, aerosol jet or a brush depending on the required design, and are subsequently subjected to a temperature treatment. Common bus bar systems are capable of conducting currents in an ampere range of up to several factors of 10 depending on the thickness and width of the bus bar without substantially conducting heat.

FIG. 1 schematically illustrates a bus bar for electrically bonding the TCO layer to the terminal 4 on the left, and a bus bar for electrically bonding the metallic Schottky contact to the terminal 5 on the right. Basically, however, many kinds of bus bar realizations may be used.

The TCO layer may be electrically bonded to two opposite bus bars, and the metallic layer may be electrically bonded to the two 90°-offset edges, and the TCO layer may be provided with a bus bar on all of the four edges, and the metallic layer may be electrically bonded in two dimensions on the rear side.

Figure 2:
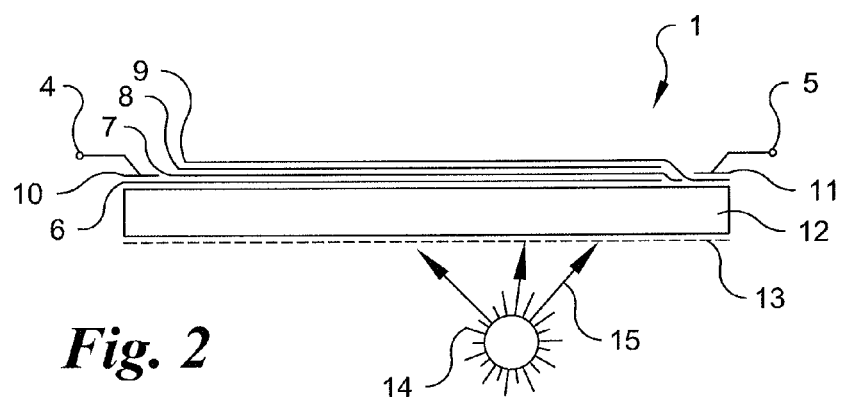
FIG. 2 is a schematic cross-section through the thin film PV system of FIG. 1.

A schematic cross-section through a simple thin film PV system 1 is shown in FIG. 2. In this case, a glass substrate 12 comprising a pyrolytically deposited TCO layer 6 may be used, such as, for instance, the TEC Glass #8/3 or 15/3.3 or 15/4 of the Pilkington Specialty Glass Products company, or types of glass that have been coated in a vacuum to be electrically conducting and largely transparent, or sol gel or electrolytic TCO coating systems may be used.

The TCO layer 6 is removed in the right-hand edge portion by laser ablation or grinding or sand-blasting or etching (i.e., the layer is structured), preferably laser by ablation or etching since such processes do not cause microcracks and a laser ablation process can be carried out today at an ablation speed of 10 to 100 cm$^2$/sec and can be very well adjusted to the layer or layer sequence to be ablated. The same likewise applies to the structuring process using etching technology.

As an alternative method of production (not illustrated in FIG. 2), the two bus bar contact lines 10, 11 can first be applied to a glass substrate and subsequently the TCO layer 6 is applied to the entire surface and structured, for example by laser ablation or etching.

Following this, the nanocrystalline semiconducting thin film 7 based on a semiconductor from the group $TiO_2$, $SrTiO_3$, $Cu_2S$, $ZnO$, $WO_3$, $CdS$, $MoS_2$, $CdSeS$, $SnO_2$, $Pb_3O_4$, $CdSe$, preferably $TiO_2$, is applied. The dry layer thickness according to the invention is 150 nm to about 2500 nm, preferably however 500 nm to 1000 nm. As a method of production, dip coating may be used on a laboratory scale. In case of larger surfaces, blade coating, roll coating, curtaining, printing or spraying is preferred as the coating process. This layer must also be realized in a structured manner. This may be done by previously having covered bus bar sections 10, 11 or by a later structuring process using etching technology or an ablation using laser technology.

The metallic Schottky contact 8 in the form of a thin layer of several 10 nm based on a metal from the group Ru, Rh, Pd, Ag, Os, Ir, Pt, Au, Al, Cr, Cu, Ni, Mo, Pb, Ta, W, in particular Pt, Pd, Au or Ni, is now applied to the semiconducting thin film 7. Among the cited metals, tests were preferentially conducted with platinum, gold, palladium and nickel.

This layer must be structured as well. For this purpose, a mask etching process or likewise laser ablation can be used. A vacuum process in the sense of sputtering or vapor deposition is very well suited as a method of production, since only a few 10 nm of layer thicknesses are required. A number of further methods may however also be used, such as chemical or electrolytic deposition.

When it is realized in a narrow shape, this metal layer 8, which can also be referred to as a Schottky electrode, can basically be connected to the bus bar 11. The essential criterion in this case is the voltage drop due to the sheet resistance being too high. For cost and operational reasons, a reinforcing and electrically well-conducting second layer 9 is usually disposed on the electrode 8. This additional layer 9 must likewise be realized to be structured. The structurization may ensue by mask etching technology or laser ablation. The second layer 9 may alternatively be produced by screen printing, stenciling, dispensing, ink jet or aerosol jet.

In FIG. 2, the glass substrate 12 is irradiated from below by the solar radiation 15 of the sun 14. In order to reduce the reflection of the incident light rays 15, the glass substrate 12 can be provided with an anti-reflective surface 13 in the form of a prismatic surface or an anti-reflective coating.

The photovoltaically generated voltage of typically about 0.4 Volt can be tapped by the electrical contacts 4, 5 at the bus bars 10, 11.

The glass substrate 2 is usually used in the form of a tempered float glass, or in the form of a partially pre-tensioned glass (TVG) or a single-pane security glass (ESG). Apart from usual float glass, an iron oxide-deficient white glass, or solar glass, is preferentially used.

Figure 3:
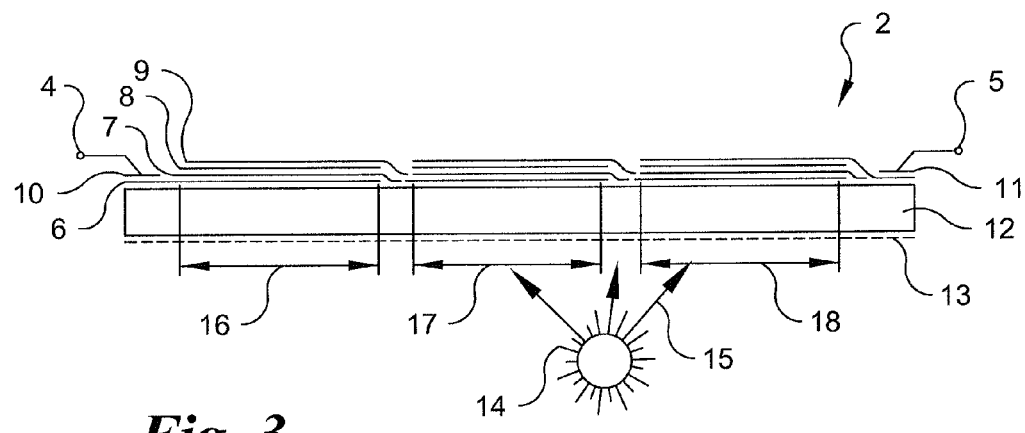
FIG. 3 is a schematic cross-section through a thin film PV multicell comprising three single cells connected in series.

FIG. 3 shows a schematic cross-section through a thin film PV multicell 2 comprised of three single cells 16, 17, 18 connected in series. With the use of a narrow width of the single cells 16, 17, 18, the additional metallic layer 9 may be omitted, and the metallic layer 8 can take over the series connection (not shown in detail). The number of cells connected in series can be realized to correspond to the respective case of application.

In the exemplary embodiment as per FIG. 3, the bus bars 10, 11 can also be applied before the TCO layer 6 is fixed. The bus bar 11 may basically also be omitted when the metallic well-conducting second layer 9 takes over the bus bar function as illustrated in FIG. 3.

Figure 4:
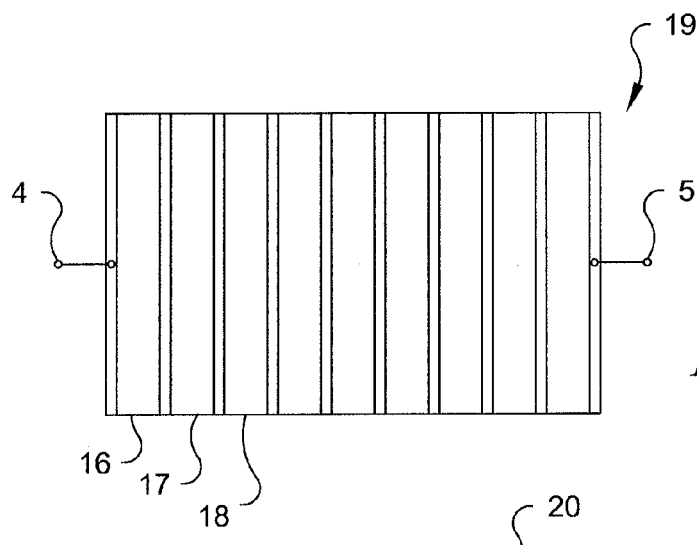
FIG. 4 is a schematic top view of a thin film PV system in a series connection.

FIG. 4 shows a schematic top view of a thin film PV system in a series connection 19. In this embodiment, oblong cells 16, 17, 18 are used in series, as depicted in FIG. 3. The number of cells may in this case be adapted to the respective application and required voltage. The narrower the single cells are formed, the lower the requirements placed on the electric conductivity of the TCO layer 6. Lesser requirements are then also placed on the electric conductivity of the layers 8, 9.

Figure 5:
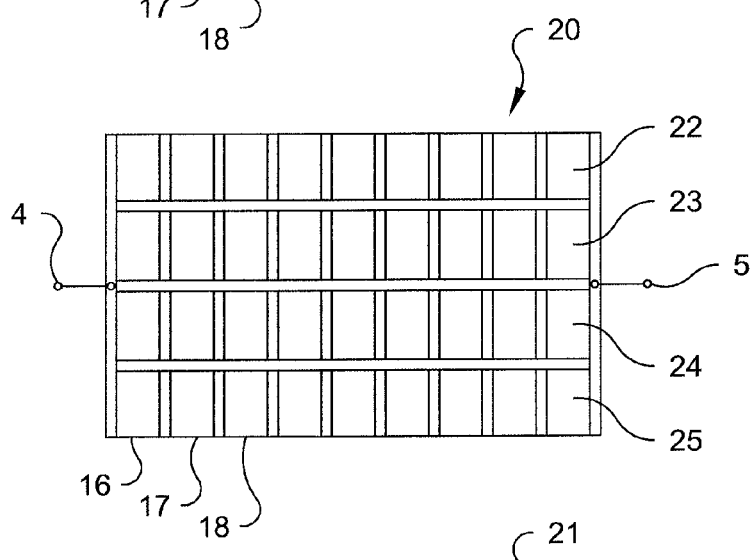
FIG. 5 is a schematic top view of a thin film PV system in a series and parallel connection.

FIG. 5 shows a schematic top view of a thin film PV system in a series and parallel connection 20. In this case, the vertically drawn cells 16, 17, 18 are separated into cell lines 22, 23, 24, 25, and the cell lines 22, 23, 24, 25 are connected in series and then electrically bonded on the broad sides to the contacts 4, 5. The number of columns 16, 17, 18, and the number of lines 22, 23, 24, 25 can be adapted to the respective application. The total voltage which can be tapped at the contacts 4, 5 is determined by the number of columns 16, 17, 18, hence the number of cells connected in series. In this configuration, the single cells must be manufactured to be highly uniform and of low variance in the essential parameters, since there is the risk of a reverse current accompanied by a destruction of cells.

Figure 6:
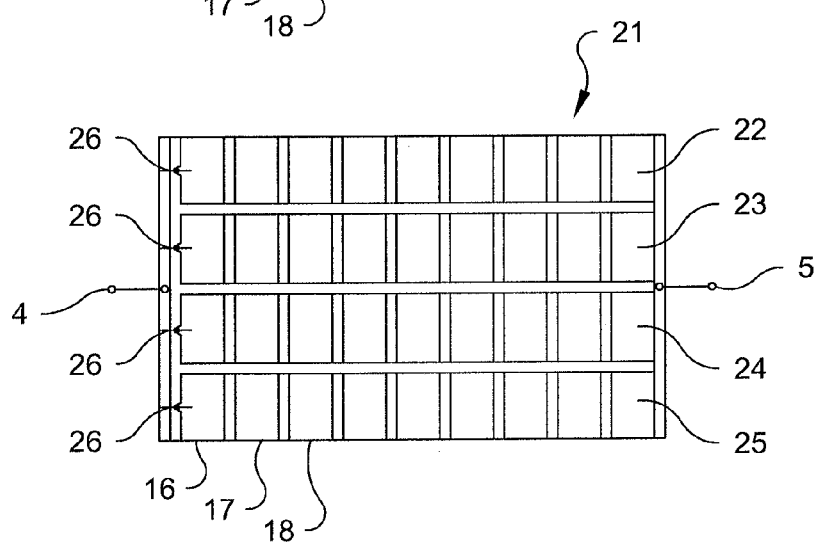
FIG. 6 is a schematic top view of a thin film PV system in a series and parallel connection including bypass diodes.

FIG. 6 shows a schematic top view of a thin film PV system in a series and parallel connection including bypass diodes 26.

This embodiment indicates one of many possible options to protect against the destruction of cells due to reverse currents, and so-called bypass diodes 26 are therefore integrated into the cells 22, 23, 24, 25 connected in series. The protective diodes or bypass diodes 26, are illustrated on the glass substrate schematically. Basically, these diodes 26 may be directly bonded to the glass in the form of SMD diodes 26, but may also be used separate from the glass, and in this case, the single cells connected in series would need to be provided with separate electrical contacts.

Figure 7:
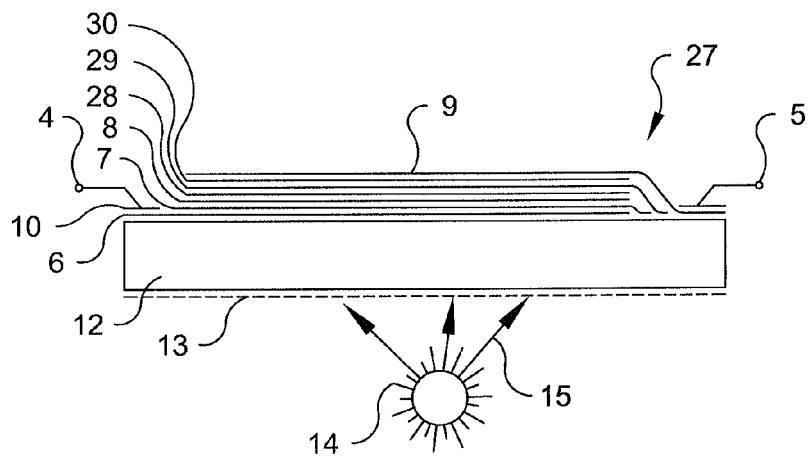
FIG. 7 is a schematic cross-section through a thin film PV double cell.

FIG. 7 shows a schematic cross-section through a thin film PV double cell 27.

Basically, only low voltages can be achieved in the thin film PV arrangement using the Schottky diode effect and the possible semiconductor-to-metal pair formations.

About 0.4 V is photovoltaically generated in the preferentially used system of TCO—$TiO_2$ (n-doped)-Pt. Such voltages are too low for many applications and usually cause high currents which are difficult to process with the usual thin film structures.

Since all of these two-dimensional Schottky diode layers are extremely thin, the double cell arranged to be superimposed in the z direction represents a relatively simple option for increasing the cell voltage by the series connection of these two superimposed cells and therewith of course also the efficiency, with the rate of the extra costs being comparatively low.

Basically, analogous to this doubling, a tripling is also possible, and 4.5 up to 1.2 V would therewith be available at the contacts 4, 5. It is to be understood that in case of such a stacking of the PV systems, these would have to be configured so as to be sufficiently transparent for the system facing away from the incident light to also absorb radiation.

In the double cell variant 27, a second TCO layer 28 is additionally arranged on the first metal layer 8 of the first cell for the purpose of improving the electrical conductivity, and the second semiconducting layer 29 and the second metal layer 30 are arranged on this layer, and the to date usual, electrically well-conducting second metal layer 9 is extended to the contact 5, respectively a bus bar 11, if any, as in the single cell.

Since the preferred nanoscale $TiO_2$ layers of semiconducting configuration usually have good absorption in the UV range, to improve the efficiency, one should pay attention to a possibly low UV absorption when selecting the metallic layers, or to select a glass substrate 12 having a possibly low UV absorption.

Furthermore, the thickness of the first and the second and, if any, the third semiconducting layers 7, 29 may be adapted to realize a uniform energy yield.

The variants having multicells arranged superimposed can also be used in series and parallel connection systems.

Figure 8:
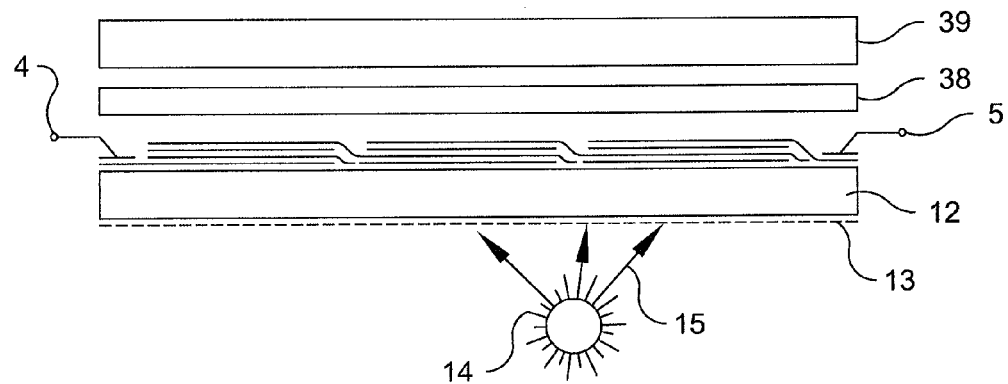
FIG. 8 is a schematic cross-section through a thin film PV arrangement in the realization of a laminate compound with an adhesive composite film.

FIG. 8 shows a schematic cross-section through a thin film PV arrangement in the realization of a laminate compound having an adhesive composite film 38.

In this arrangement, an adhesive composite film 38 in the form of a film of ethylene vinyl acetate (EVA) or polyvinyl butyral (PVB) is provided with a rear substrate 39 for the purpose of lamination. In the manufacturing process of crystalline PV modules, EVA films having a polymeric sandwich laminate 39 and a relatively simple table laminator are usual, and PVB films having a thickness of at least 370 μm or double and triple that are usually used in connection with a glass substrate 39 in the field of façade glass. The sandwich laminate 39 may in this case be a laminate of a thin PVF film having a thin PET film, and a thin aluminum foil may also be arranged in between as a water vapor barrier layer. An Icosolar film from the Isovolta company is mentioned as a typical example. The advantage of using such a rear substrate 39 resides in the lower weight as compared to a glass having a thickness of 3 to 6 mm, and in the easier laminating process.

When a rear substrate 39 in the form of glass is used, an ESG compound may be realized, and with it, and with the use of PVB as the adhesive composite film 38, façade elements in buildings, or in canopy elements or general roof elements and parapet elements can be realized. Usually, a glass substrate 39 in the form of an at least partially pre-tensioned glass (TVG) or a single-pane security glass (ESG) is used in this case.

Figure 9:
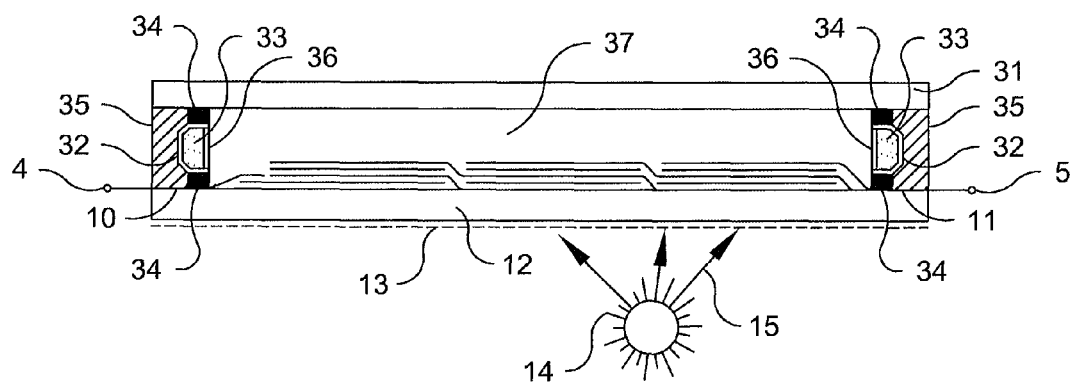
FIG. 9 is a schematic cross-section through a thin film PV arrangement in an insulating glass compound having a glass pane on the rear side.

FIG. 9 shows a schematic cross-section through a thin film PV arrangement in an insulating glass compound having a rear glass pane 31. The thin film PV arrangement is in this realization disposed on level 2, hence the inner side of the glass pane 12. Basically, the thin film PV arrangement can also be disposed on level 3, hence the inner side of glass pane 31. Then, however, the inner side of pane 12 will reflect light and would have to be provided with an anti-reflective layer, so as to prevent the incident sun rays 15 of the sun 14 from being too strongly reduced.

The insulating glass compound of the two glass panes 12, 31 is in this case produced according to prior art, hence with a circumferential spacer profile 32 having a filled drying agent 33 therein and openings 36 in the spacer to the inner space 37 of the insulating glass.

The spacer is connected to the two glass panes 12, 31 by a primary sealing agent 34 such as butylene, or polyisobutylene (PIB), and circumferentially closed by a secondary sealing agent 35. As the secondary sealing agent 35, silicone or polydimethyl siloxane (PDMS) or polyurethane (PU) or polysulfide (PS), can be used.

The inner space 37 of the insulating glass can be filled with an inert noble gas, such as argon or xenon or krypton, at the pressure which also prevails outside the insulating glass system. The terminals 4, 5 can also be manufactured in a multiple realization by the bus bar system 10, 11. Attention has to be paid in this case that there is no water vapor diffusion between the bus bar lines and the glass. Furthermore, all of the layers 6, 7, 8, 28, 29, 30 should be removed from below the primary and secondary sealing agents 34, 35, since an infiltration into such layers could occur and a diffusion of water vapor into the inner space 37 of the insulating glass could take place.

In a further development of this insulating glass-thin film-PV system, a composite security glass-thin film-PV system as outlined in FIG. 8 can be used instead of the glass 12.

Figure 10:
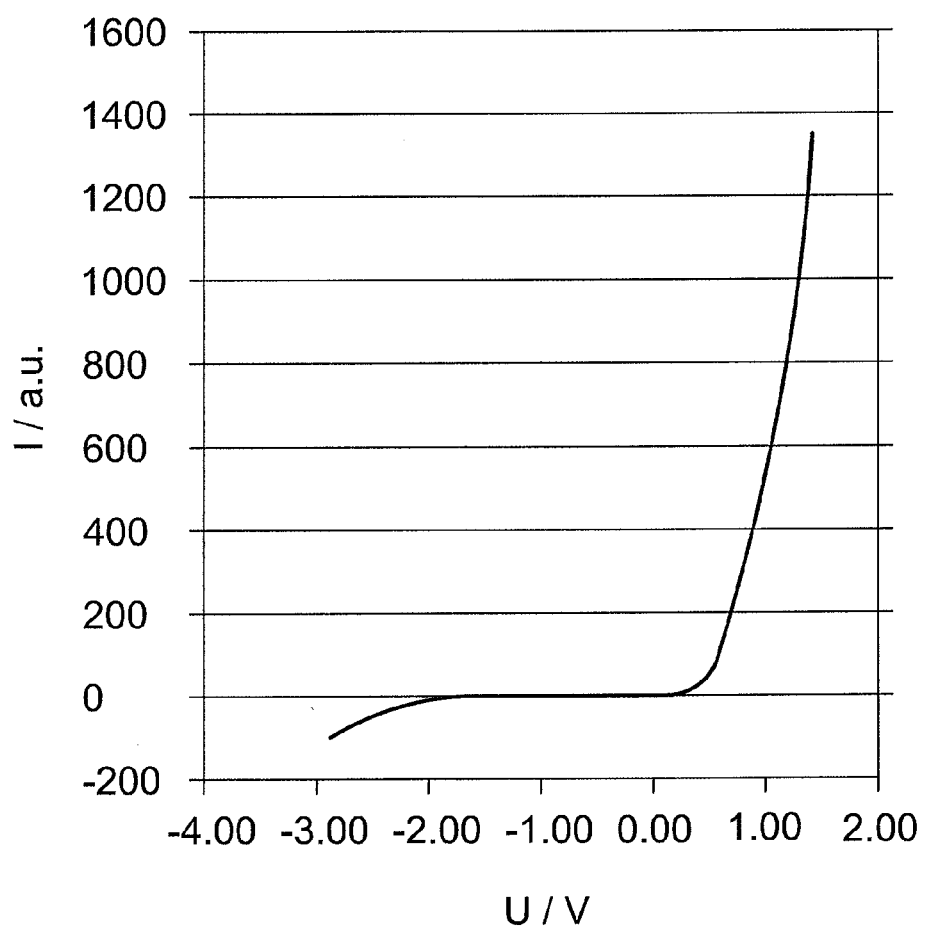
FIG. 10 is graph of a current-voltage characteristic for a two-dimensionally doped $TiO_2$ layer of typically 150 nm on a glass substrate with a TCO coating (Tec Glass from Pilkington) and a thin platinum Schottky electrode having a layer thickness of 20 nm.

FIG. 10 illustrates a current-voltage characteristic for a two-dimensionally doped $TiO_2$ layer of typically 150 nm on a glass substrate having a TCO coating (Tec Glass from Pilkington) and a thin platinum Schottky electrode having a layer thickness of 20 nm.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A method of producing a thin film photovoltaic system having a two-dimensional metal chalcogenide compound semiconductor layer as an absorber of sunlight and a first metal layer applied to the metal chalcogenide compound semiconductor layer, wherein the metal chalcogenide compound semiconductor layer and the metal layer form a Schottky contact at their contact face, the method comprising applying a dispersion containing nanoscale particles having a diameter of about 3 nm to about 30 nm to a transparent substrate material to produce the metal chalcogenide compound semiconductor layer, wherein a layer thickness of the metal chalcogenide compound semiconductor layer applied to the substrate material ranges from about 150 nm to about 2500 nm.

2. The method according to claim 1, wherein the layer thickness of the metal chalcogenide compound semiconductor layer applied to the substrate material ranges from about 500 nm to about 1000 nm.

3. The method according to claim 1, wherein the metal chalcogenide compound semiconductor layer is applied to the substrate material by blade coating, roll coating, curtaining, printing or spraying.

4. The method according to claim 1, wherein the metal chalcogenide compound semiconductor comprises a semiconductor material selected from the group $TiO_2$, $SrTiO_3$, $Cu_2S$, $ZnO$, $WO_3$, $CdS$, $MoS_2$, $CdSe$, $SnO_2$, $Pb_3O_4$, and $CdSe$.

5. The method according to claim 4, wherein the metal chalcogenide compound semiconductor comprises $TiO_2$.

6. The method according to claim 1, wherein the first metal layer comprises a metal from the group Ru, Rh, Pd, Ag, Os, Ir, Pt, Au, Al, Cr, Cu, Ni, Mo, Pb, Ta, and W.

7. The method according to claim 6, wherein the first metal layer comprises Pt, Pd, Au or Ni.

8. The method according to claim 1, wherein a thickness of the first metal layer applied to the metal chalcogenide compound semiconductor layer is about 10 nm to about 20 nm.

9. The method according to claim 1, wherein a second reinforcing metal layer is applied to a side of the first metal layer facing away from the metal chalcogenide compound semiconductor layer, and wherein a material of the second reinforcing metal layer is selected such that an ohmic contact is formed between the first metal layer and the second reinforcing metal layer.

10. The method according to claim 1, wherein the transparent substrate material is a glass substrate, wherein the transparent substrate material has a translucent or transparent conductive layer.

11. The method according to claim 10, wherein the transparent substrate material is a tempered or non-tempered float glass in the form of single-pane security glass, and wherein the conductive layer is a TCO layer, optionally a FTO layer, on a side to be coated with the metal chalcogenide compound semiconductor layer.

12. The method according to claim 1, wherein a plurality of thin film photovoltaic systems are applied adjacent one another in a manner of modules on a common transparent substrate material, wherein the plurality of thin film photovoltaic systems is created by structuring a thin film photovoltaic system uniformly applied to the substrate material.

13. The method according to claim 12, wherein the plurality of thin film photovoltaic systems is applied to a common substrate material in the manner of a matrix, wherein the thin film photovoltaic systems are connected in series by lines and in parallel by columns.

14. The method according to claim 1, wherein a plurality of thin film photovoltaic systems is created to be superimposed as a stack on a common substrate material.

15. The method according to claim 1, wherein at least one thin film photovoltaic system is laminated into a unit by an adhesive composite film and a rear substrate.

16. The method according to claim 15, wherein the rear substrate is a glass substrate selected from float glass (non-tempered), partially pre-tensioned float glass (TVG), single-pane security glass (ESG), and a composite security glass (VSG) and is created jointly with the glass substrate material carrying the metal chalcogenide compound semiconductor layer by an autoclave process.

17. The method according to claim 15, wherein the rear substrate has a form of a polymeric film sandwich comprising a thin PVF film and a PET film, wherein an aluminum foil is incorporated between the two films as a water vapor barrier.

18. The method according to claim 1, wherein at least one thin film photovoltaic system is arranged inside an insulating glass compound, optionally on an inner face of a glass pane on a sun side.

* * * * *